(12) United States Patent
Fontanet et al.

(10) Patent No.: US 12,000,181 B2
(45) Date of Patent: Jun. 4, 2024

(54) DEVICE FOR DETECTING BY INDUCTION AN INTENTION TO LOCK A MOTOR VEHICLE DOOR WITH A TARGET ON A LEVER ARM

(71) Applicant: Vitesco Technologies GmbH, Hanover (DE)

(72) Inventors: Alain Fontanet, Toulouse (FR); Armand Castandet, Toulouse (FR)

(73) Assignee: VITESCO TECHNOLOGIES GMBH, Hannover (DE)

( * ) Notice: Subject to any disclaimer, the term of this patent is extended or adjusted under 35 U.S.C. 154(b) by 484 days.

(21) Appl. No.: 17/059,370

(22) PCT Filed: May 21, 2019

(86) PCT No.: PCT/FR2019/051152
§ 371 (c)(1),
(2) Date: Nov. 27, 2020

(87) PCT Pub. No.: WO2019/229330
PCT Pub. Date: Dec. 5, 2019

(65) Prior Publication Data
US 2021/0238897 A1 Aug. 5, 2021

(30) Foreign Application Priority Data
May 28, 2018 (FR) ........................................ 1854521

(51) Int. Cl.
*E05B 81/76* (2014.01)
*H03K 17/97* (2006.01)
*E05B 81/78* (2014.01)

(52) U.S. Cl.
CPC ............. *E05B 81/77* (2013.01); *H03K 17/97* (2013.01); *H03K 2017/9706* (2013.01)

(58) Field of Classification Search
CPC ................................ E05B 81/76; E05B 81/77
See application file for complete search history.

(56) References Cited

U.S. PATENT DOCUMENTS

| 6,998,968 B2* | 2/2006 | Garnault | E05B 81/78 340/542 |
| 7,210,715 B2* | 5/2007 | Kobayashi | E05B 81/76 70/237 |

(Continued)

FOREIGN PATENT DOCUMENTS

| CN | 101580052 A | 11/2009 |
| CN | 105421907 A | 3/2016 |

(Continued)

OTHER PUBLICATIONS

International Search Report and Written Opinion of the ISA for PCT/FR2019/051152 dated Sep. 26, 2019, 11 pages.

(Continued)

*Primary Examiner* — Carlos Lugo
(74) *Attorney, Agent, or Firm* — NIXON & VANDERHYE

(57) ABSTRACT

The invention relates to a device for detecting the intention to unlock an opening element (1) of a motor vehicle with a housing (4) containing a support element (12) having a region of contact (11) with a handle (2) and being associated with an amagnetic metal target (6), the device comprising a printed circuit board (9), a voltage source and at least one emitter primary coil (7). The support element (12) forms an elongated lever arm, the target (6) being arranged at its longitudinal free end with its other longitudinal end fixed to an anchoring point (14) on the housing (4) while being flexible toward the primary coil (7) under the action of the pressure from the user on the opening element handle (2) or frame which is transmitted to the contact region (11) located (Continued)

away from the target (6) by more than half of a length of the support element (12).

23 Claims, 1 Drawing Sheet

(56) References Cited

U.S. PATENT DOCUMENTS

| | | | |
|---|---|---|---|
| 7,654,147 B2 * | 2/2010 | Witte | E05B 81/78 |
| | | | 73/781 |
| 7,884,293 B2 * | 2/2011 | Ulomek | E05B 81/76 |
| | | | 200/61.76 |
| 8,269,615 B2 | 9/2012 | Ieda et al. | |
| 8,454,062 B2 * | 6/2013 | Rohlfing | E05B 81/78 |
| | | | 292/336.3 |
| 9,640,006 B2 | 5/2017 | Guibbert et al. | |
| 9,741,505 B2 * | 8/2017 | Choi | H01H 13/08 |
| 10,428,562 B2 | 10/2019 | Guibbert et al. | |
| 10,889,266 B2 * | 1/2021 | Godet | B60R 25/01 |
| 11,078,692 B2 * | 8/2021 | Spick | H03K 17/975 |
| 11,402,236 B2 * | 8/2022 | Vaysse | E05B 81/77 |
| 2003/0029210 A1 | 2/2003 | Budzynski et al. | |
| 2003/0101781 A1 | 6/2003 | Budzynski et al. | |
| 2020/0047712 A1 * | 2/2020 | Spick | H04B 5/26 |

FOREIGN PATENT DOCUMENTS

| | | | | |
|---|---|---|---|---|
| CN | 106338772 A | | 1/2017 | |
| DE | 10249579 A1 * | | 5/2004 | E05B 81/76 |
| DE | 102015103516 A1 * | | 9/2016 | |
| DE | 10 2015 119 096 | | 5/2017 | |
| DE | 102016219748 A1 * | | 4/2018 | |
| EP | 1840845 A2 * | | 10/2007 | E05B 81/78 |
| EP | 2 088 267 A2 | | 8/2009 | |
| EP | 2088267 A2 * | | 8/2009 | E05B 39/007 |
| FR | 3 013 069 A1 | | 5/2015 | |
| FR | 3 044 037 | | 5/2017 | |
| FR | 3 044 146 | | 5/2017 | |
| WO | 01/40606 A1 | | 6/2001 | |
| WO | WO-2019234225 A1 * | | 12/2019 | E05B 81/77 |

OTHER PUBLICATIONS

Office Action issued in Chinese Patent Application No. 201980050118.6 dated Jul. 12, 2021.

* cited by examiner

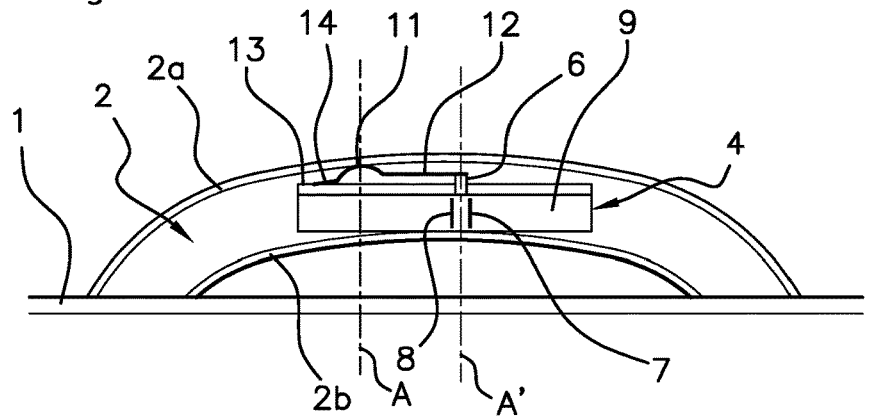
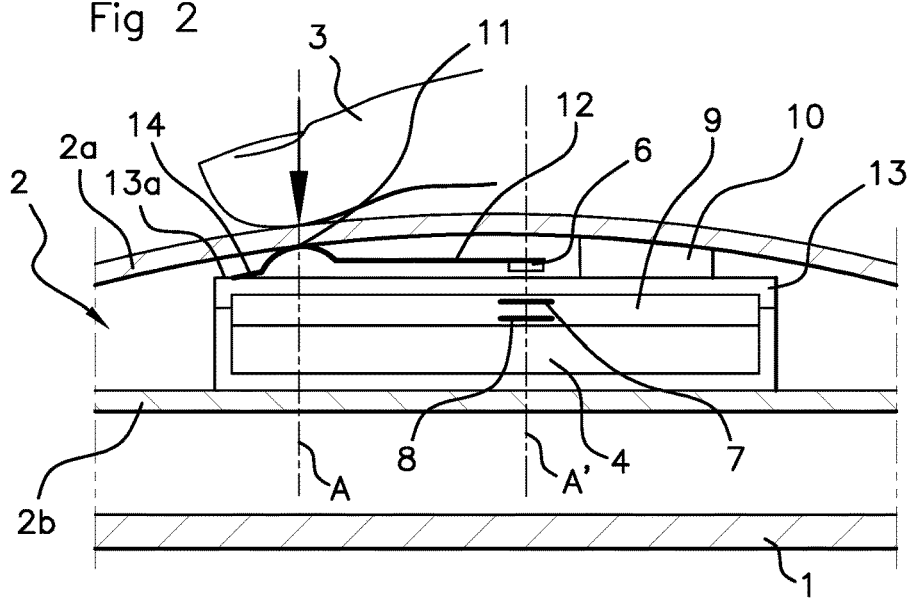
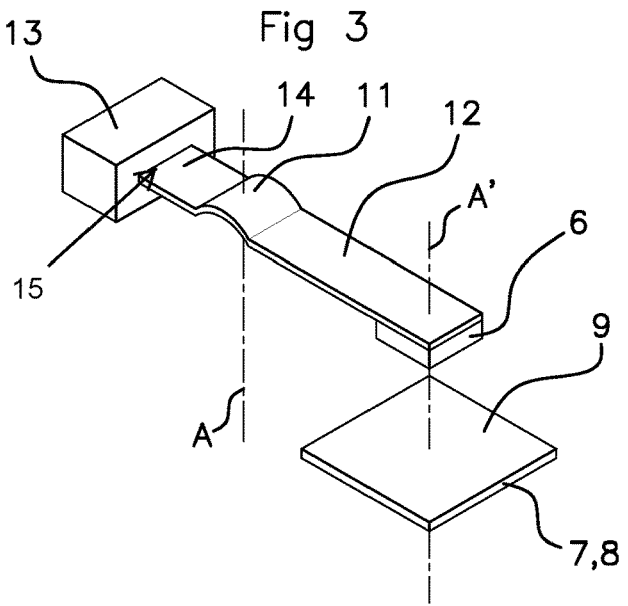

DEVICE FOR DETECTING BY INDUCTION AN INTENTION TO LOCK A MOTOR VEHICLE DOOR WITH A TARGET ON A LEVER ARM

This application is the U.S. national phase of International Application No. PCT/FR2019/051152 filed May 21, 2019 which designated the U.S. and claims priority to FR Patent Application No. 1854521 filed May 28, 2018, the entire contents of each of which are hereby incorporated by reference.

The present invention relates to a device for detecting the intention of a user to lock or unlock an opening element of a motor vehicle, this device operating by induction with at least one emitter primary coil.

The detection device is intended to be integrated into an opening element handle or frame and consists of a housing containing an element that is elastically deformable along a predetermined axis comprising a contact region internal to the handle facing a contact region for contact with a hand of the user on an external contour of the handle.

The device comprises a printed circuit board, a voltage source and at least one emitter primary coil, the deformable element being associated with an amagnetic metal target having a planar surface, a variation in the position of the target moving along the predetermined axis occurring under pressure from a hand of the user on the handle.

Nowadays, vehicle door handles are fitted with devices for detecting the presence of a user. The detection of the presence of a user, coupled with the recognition of a "hands-free" electronic fob for remote access control carried by this user, allows the remote locking and unlocking of the opening elements of the vehicle. Thus, when the user, carrying the corresponding electronic fob identified by the vehicle, wishes to unlock the vehicle, they approach the handle or touch the door handle of the vehicle, and the opening elements of the vehicle are then automatically unlocked.

By approaching or by pressing on a precise location of the handle of an opening element of the vehicle, called "unlocking region", the opening element or all of the opening elements of the vehicle is/are unlocked without any other action from the user. Conversely, when the user, still carrying the necessary fob identified by the vehicle, wishes to lock their vehicle, they close the door of their vehicle and they approach or momentarily press on another precise location of the handle, called "locking region". This movement makes it possible to lock the opening elements of the vehicle automatically.

These presence detection devices generally comprise two capacitive sensors, in the form of two electrodes connected electrically to a printed circuit board and integrated into the door handle, each in a precise locking or unlocking region. Generally, one electrode is dedicated to each region, that is to say one electrode is dedicated to detecting the approach and/or the contact of the hand of the user in the locking region and one electrode is dedicated to detecting the approach and/or the contact of the hand of the user in the unlocking region.

The presence detection device further comprises a generally low-frequency radiofrequency antenna. The detection device is connected to an electronic computer of the vehicle in a control unit and sends it a presence detection signal. The electronic computer of the vehicle has, beforehand, identified the user as being authorized to access this vehicle, or alternatively, following the reception of this presence detection signal, it performs this identification. To this end, it sends an identification request to the fob carried by the user by way of the radiofrequency antenna.

The fob in response sends its identification code to the electronic computer of the vehicle through radiofrequency waves. If the electronic computer recognizes the identification code as the one authorizing access to the vehicle, it triggers the locking/unlocking of one or of all of the opening elements. If, however, the electronic computer has not received any identification code or if the received identification code is erroneous, locking or unlocking is not performed.

Such vehicles are therefore equipped with opening element handles comprising a detection device, itself comprising a generally low-frequency radiofrequency antenna, and two electrodes connected to a microcontroller, integrated into a printed circuit board and supplied with a voltage.

However, this detection device of the prior art has major drawbacks. Specifically, the detection of the approach of a user by capacitive sensors is not robust and generates false detections.

In particular, in some environmental conditions, when the ambient air is humid or when there is salt on the roads, capacitive coupling is created between the detection regions and the metal parts of the vehicle, thereby preventing any detection of the presence of a user using the capacitive sensors.

In addition, raindrops or snowflakes on the door handle increase the capacitance value measured by the capacitive sensors, thus triggering false detections.

Lastly, detection by capacitive sensors is incompatible with handles coated with metallic paints or comprising chromed surfaces, the presence of metal in the handle creating a coupling with the detection regions and inhibiting the detection of the presence of a user.

To overcome these drawbacks, it has been proposed, in particular by document FR-A-3 044 146, to use an inductive sensor in the device for detecting the intention to lock or unlock an opening element, the inductive sensor comprising inter alia an amagnetic metal target and a coil emitting a magnetic field. The amagnetic metal target is able to move along a predetermined axis substantially perpendicular to the plane of the primary coil.

The emitter coil is connected to a capacitor and forms, with the capacitor, an oscillating circuit having a specific resonant frequency with means for adjusting the frequency of the oscillating circuit to a predetermined frequency. The target is connected by means for transmitting a deformation of an element that is elastically deformable along the predetermined axis arranged in a handle of the opening element and comprising a region of contact internal to the handle with the amagnetic metal target causing its movement.

Means for measuring an inductance of the coil are provided as well as means for comparing the measured inductance with a predetermined inductance threshold value, in order to detect the intention of the user to lock or unlock the door.

The target, as an electrically conductive part, is positioned, when pressure from the hand of a user is applied to the handle of the opening element, in the vicinity of a coil supplied with a frequency that is sufficiently high, for example a few megahertz, to generate a substantial skin effect in the conductive part.

A variation in the position of the conductive part therefore causes the specific inductance of the coil to vary. The flux produced by the coil does not penetrate into the conductive part because of the skin effect.

The variation in the inductance and the variation in the specific frequency of the coil are detected in order to detect the variation in the position of the target. As this target can be placed such that it is connected to a portion of the handle via the elastically deformable contact element, when the user presses their hand against this portion of the handle, the position of the target varies. The inductance of the coil also varies. Suitable electronics can therefore detect the pressure from the hand and effect a closing or opening of the opening element of the motor vehicle.

The variation in the position of the target caused by pressing the hand against the handle is very small, of the order of a few hundredths of a millimeter. The handle must be deformed in a highly specific region, but the force transmitted is limited because the printed circuit board beneath the conductive part cannot be deformed. Reliability of detection is therefore not guaranteed. In this prior art, the movement of the target occurs perpendicular to the plane of the emitter coil, and only the small movement of the target can cause the inductance of the coil to vary.

The problem underlying the present invention is, for a device for detecting the intention of a user to lock or unlock an opening element of a motor vehicle, this detection device operating according to the principle of an induction sensor with a target that moves in relation to one or more coils when the hand of a user is pressed against a handle or a frame of the opening element, increasing a travel of the target with respect to the one or more coils.

To this end, the present invention relates to a device for detecting the intention of a user to lock or unlock an opening element of a motor vehicle, the device being intended to be integrated into an opening element handle or frame and consisting of a housing containing a support element, a variation in the position of which along a predetermined axis occurs under pressure from a hand of the user on the opening element handle or frame, the support element having a region of contact with the opening element handle or frame and being associated with an amagnetic metal target, the device comprising a printed circuit board, a voltage source and at least one emitter primary coil, noteworthy in that the support element forms an elongated lever arm, the target being arranged at a longitudinal free end of the lever arm which has its other longitudinal end fixed to an anchoring point on the housing, the lever arm being flexible toward the primary coil under the action of the pressure from the user on the opening element handle or frame which is transmitted to the contact region, the contact region being located away from the target by more than half of a total length of the support element.

As the pressure from the hand, advantageously just one finger, of the user is low, the lowering of the target in the detection device is very limited and to increase it, according to the invention, a lever arm is provided as a support element, one end of the lever arm bearing against a fixed support and the other bearing the target. A pressure, for example on the middle of the length of the lever arm or more advantageously closer to the anchoring end than to the free end of the support element bearing the target results in a more pronounced inflection of the target at the end of the lever arm and therefore in a substantially linear movement of greater amplitude than that obtained by means of a device according to the prior art for which the target is aligned with the contact region, which is itself aligned with the region of pressure from the hand of the user.

The use of a target placed at the free end of a support element acting as a lever arm by being fixed to an anchoring point at its other end makes it possible to greatly increase the relative movement of the conductive part, this movement being amplified the more flexible the support element is and the closer to the anchoring point, and therefore the further from the target, the pressure is applied. As a result, the detection of the hand of a user pressing against an opening element handle or frame is increased.

Advantageously, the support element is in the form of a flexible strip that is elastically returned to a position corresponding to no pressure from a hand of a user on the opening element handle or frame. The flexible strip, which is advantageously made of metal, is a strong but also very flexible support element and it is returned elastically to its position without pressure on its contact region.

Advantageously, the support element forms a single piece with the target, being made of an amagnetic conductive metal material.

Advantageously, the support element and the target are made of brass or bronze. Brass and bronze can easily be worked into the shape of a flexible strip and in addition are a magnetic metal elements that can be welded easily.

Advantageously, the longitudinal end of the support element which is fixed to an anchoring point on the housing is secured toward a longitudinal end of the housing, the support element extending over more than half of a length of the housing.

Advantageously, the support element is borne outside the detection device on a longitudinal end of a cover enclosing the housing, the cover having an opening through which penetrates a free longitudinal end portion of the support element bearing the target.

Advantageously, the contact region is a convex portion of the support element which is turned away from the printed circuit board toward the exterior of the device.

Advantageously, the primary coil is positioned on the printed circuit board and faces the target when the support element is in the flexed position, the target being borne on a face of the support element that is turned toward the primary coil and the printed circuit board.

Advantageously, the device comprises at least one secondary coil that receives a magnetic field induced by said at least one primary coil, a variation in the magnetic field and induced voltage received by said at least one secondary coil being detected by measurement means for measuring a parameter resulting from the voltage induced in the secondary coil when pressure from a hand of the user is applied to the opening element handle or frame.

Advantageously, said at least one primary coil and secondary coil are arranged in parallel respective planes, and perpendicular to a plane of the printed circuit board, a length of the target extending perpendicular to the longitudinal free end of the support element, or said at least one primary coil and secondary coil are arranged in respective planes that are parallel to the plane of the printed circuit board, a length of the target extending parallel to and bearing against the longitudinal free end portion of the support element.

Advantageously, the support element forms an electrode for a capacitive sensor, the device fulfilling the dual function of inductive sensor and of capacitive sensor. This makes it possible to group an inductive sensor with a capacitive sensor and therefore to make detection more reliable by using two different detection means.

The invention relates to an external handle or a frame of an opening element of a motor vehicle, noteworthy in that it comprises such a detection device and at least one elastically deformable external contour region that is aligned along the predetermined axis with the contact region.

The invention relates to a motor vehicle noteworthy in that it comprises at least one such external handle or frame of an opening element.

Other features, aims and advantages of the present invention will become apparent on reading the detailed description that follows and on examining the appended drawings given by way of non-limiting examples, and in which:

FIG. 1 schematically shows a sectional view of a motor vehicle door handle with a device for detecting the intention of a user to lock or unlock a motor vehicle door, this device being in accordance with one embodiment according to the present invention comprising a flexible support element, FIG. 2 schematically shows a sectional view of a motor vehicle door handle at the level of the device for detecting the intention of a user to lock or unlock a motor vehicle door according to one embodiment of the present invention, the device comprising a flexible support element for supporting a target that moves when a hand of a user presses against the handle, FIG. 3 schematically shows a perspective view of an assembly of a target and its flexible support element, the target facing a printed circuit board that bears one or more coils, the target being lowered toward the printed circuit board due to the flexibility of the support element when pressure from the hand of the user on a handle or frame of an opening element is transmitted to the support element, the support element, the target and the printed circuit board forming part of a device according to the present invention.

With particular reference to FIGS. 1 and 2, the present invention relates to a device for detecting the intention of a user to lock or unlock an opening element 1 of a motor vehicle. The opening element 1 is advantageously a motor vehicle door but may also be the trunk of the motor vehicle or any other opening element of the motor vehicle.

The device is intended to be integrated into an element of the opening element 1, most frequently a handle 2 but also a frame of the opening element 1, and consists of a housing 4 containing a support element 12, a variation in the position of which along a predetermined axis A occurs under pressure from a hand 3 of the user on the opening element handle 2 or frame.

The support element 12 has a region of contact 11 with the opening element handle 2 or frame and is associated with an amagnetic metal target 6. In addition, the device comprises a printed circuit board 9, a voltage source and at least one emitter primary coil 7.

According to the invention, the support element 12 forms an elongated lever arm, the target 6 being arranged at a longitudinal free end of the lever arm which has its other longitudinal end fixed to an anchoring point 14 on the housing 4. The lever arm as a support member 12 is flexible toward the primary coil 7 under the action of the pressure from the user on the opening element handle 2 or frame which is transmitted to the contact region 11.

The contact region 11 is located away from the target 6 by more than half of a total length of the support element 12, so that pressure from the hand 3 of the user on the handle 2 or frame is transmitted to the contact region 11 and causes a more pronounced movement of the target 6 than the same pressure exerted on the target 6 would cause due to the pronounced flexion of the free end of the support element 12 bearing the target 6.

As can be seen with reference to FIG. 2, the device comprises a printed circuit board 9, a voltage source and at least one emitter primary coil 7. In FIG. 2, the primary coil 7 is shown as one turn and a secondary coil 8 is shown represented by one turn. The number of turns may of course be higher.

The invention also relates to an external handle 2 or frame of a motor vehicle opening element 1 comprising such a detection device and at least one elastically deformable external contour region that is aligned along the predetermined axis A with the contact region 11.

As can be seen in FIG. 2, a finger 3 of the user presses against the external face of an external portion of the handle 2 which is outermost with respect to the vehicle. This pressure is transmitted to the contact region 11 borne by the support element 12, advantageously close to its fixed anchoring point 14 on the housing 4, in any case closer to this fixed anchoring point 14 than to the target 6 located at the other longitudinal end of the support element 12.

This takes place along a first predetermined axis denoted by A. This pressure on the contact region 11 is transmitted to the target 6 which moves closer to the printed circuit board 9 by moving along a second predetermined axis A' parallel to the first predetermined axis A but at a distance from this first predetermined axis A.

The invention also relates to a motor vehicle comprising at least one such opening element handle 2 or frame.

As non-essential features of the present invention, the housing 4 containing the support element 12 may rest on an internal portion 2b of the handle 2 opposite an external portion 2a of the handle 2 which is facing away from the vehicle and against the external face of which external portion 2a the finger 3 of the user is pressed.

The internal portion 2b of the handle 2 rests against the opening element 1 of the motor vehicle or is facing the opening element 1 of the motor vehicle. It is between the internal portion 2b of the handle 2 facing the opening element 1 and the external portion 2a of the handle 2 facing away from the vehicle that an empty space houses the detection device according to the present invention integrated into the housing 4.

The housing 4 may be open at its end facing the exterior of the handle 2 and covered with a cover 13, which however lets the support element 12 with its contact region 11 protrude from the housing 4. Between the cover 13 and the internal wall of the external portion 2a of the handle 2, inside the handle 2, a layer of foam 10 may be locally inserted.

With reference to all of the figures, the support element 12 may be in the form of a flexible strip that is elastically returned to a position corresponding to no pressure from a hand 3 of a user on the opening element handle 2 or frame. This is the rest position of the support element 12 for which no intention to lock is detected. It is therefore normal for the support element 12 to automatically return to this position when no pressure from a hand 3 of the user on the opening element handle 2 or frame is detected.

In one preferred embodiment of the present invention, the support element 12 forms a single piece with the target 6, being made of an amagnetic conductive metal material. The target 6 may also be welded or glued to the support element 12. The target 6 may also comprise fixing means for securing it to the support element 12.

The support element 12 and the target 6 may be made of different metal amagnetic materials, for example brass or bronze. Brass and bronze exhibit good flexibility and can be easily welded.

By way of non-limiting example, the support element 12 and the target 6 may be made of amagnetic iron with a magnetic permeability p equal to 1. The problem arising from this specific material is that during the manufacture of the support element 12 for supporting the target 6, due to the treatments in which the constituent material of the support element 12 is wound or unwound, this support element 12 regains a magnetic permeability higher than 1. It may then be a good idea to subject it to a subsequent demagnetization treatment.

As can be seen in FIG. 2, the longitudinal end of the support element 12 which is fixed to an anchoring point 14 on the housing 4 can be secured toward a longitudinal end 13a of the housing 4, the support element 12 extending over more than half of a length of the housing 4. This longitudinal end may be a longitudinal end 13a of the cover 13 covering the housing 4.

The support element 12 may therefore be borne at least partially outside the detection device on a longitudinal end 13a of a cover 13 enclosing the housing 4. The cover 13 may have an opening 15 through which penetrates a free longitudinal end portion of the support element 12 bearing the target 6, which takes place when the support element 12 flexes under pressure exerted on its contact region 11 located away from the target 6.

As can be seen in FIG. 3, the longitudinal end of the support element 12 may be anchored to an anchoring point 14 which is close to a longitudinal end 13 of the cover 13 but which however might not belong to the cover 13 of the housing 4 of the device. This anchoring point 14 may have a groove, not visible in the figures, into which is inserted a longitudinal end portion of the support element 12 which may be glued or welded to the anchoring point 14.

As can best be seen in FIGS. 1 and 2, the contact region 11 is a convex portion of the support element 12 which is turned away from the printed circuit board 9 toward the exterior of the device. The contact region 11 may be of convex shape with respect to the external portion 2a of the handle 2 with a highest point pointing toward the external portion 2a and through the middle of which the first predetermined axis A passes, passing through a bearing region against which bears the finger of a user on the external face of the external portion 2a of the handle 2.

It is possible for this bearing region to be recognizable from the outside of the vehicle so that the user always presses in the same place on the handle 2 in the same bearing region borne by the external face of the external portion 2a of the handle 2.

As shown in FIG. 2, the primary coil 7 may be positioned on the printed circuit board 9 facing the target 6 when the support element 12 is in the flexed position, i.e. being aligned with the target 6 on the same second predetermined axis A' mentioned above and parallel to the first predetermined axis A. The target 6 may be borne on a face of the support element 12 that is turned toward the primary coil 7 and the printed circuit board 9, facing them, at the free end of the support element 12.

There may be several different optional arrangements of the target 6 and of the emitter primary coil 7 and of at least one receiver secondary coil 8.

In a first option, a single emitter primary coil 7 may be used, advantageously connected to a capacitor and forming with the capacitor an oscillating circuit that has its own resonant frequency. The detection device then comprises measurement means for measuring an inductance of the coil and comparison means for comparing the measured inductance with a predetermined threshold inductance value representative of passage of the target 6 under the indirect action of pressure from the finger of a user on the external portion of the opening element handle 2 or frame being transmitted to the contact region 11 and then to the support element 12 by flexing it and the target 6 along with it, in order to detect the intention of a user to lock or unlock the opening element 1 of the motor vehicle.

In a second option, the device may comprise at least one receiver secondary coil 8 receiving a magnetic field induced by said at least one primary coil 7, a variation in the induced magnetic field received by said at least one secondary coil 8 being detected by measurement means for measuring a parameter of a current induced in the secondary coil 8 when pressure from a hand 3 of the user is applied to the opening element handle 2 or frame. Several arrangements of target 6 and of primary and secondary coils are then possible.

In a first, preferred optional embodiment for positioning the primary 7 and secondary 8 coils with respect to the target 6, the one or more primary coils 7 and the one or more secondary coils 8 are arranged in parallel respective planes, and perpendicular to a plane of the printed circuit board 9, a length of the target 6 extending perpendicular to the longitudinal free end of the support element 12. This first, preferred optional embodiment is shown in FIG. 1.

In a second optional embodiment for positioning the primary 7 and secondary 8 coils with respect to the target 6, the one or more primary coils 7 and the one or more secondary coils 8 are arranged in respective planes that are parallel to the plane of the printed circuit board 9, a length of the target 6 extending parallel to and bearing against the longitudinal free end portion of the support element 12. This second optional embodiment is shown in FIG. 2.

In the first embodiment, the movement of the target 6 has a guillotine effect with respect to the printed circuit board 9. It is a longitudinal area of the target 6 which is interposed between the primary and secondary coils instead of the target 6 being brought closer to the primary 7 and secondary 8 coils. A greater variation in flux is thus obtained, the area of the target 6 influencing this variation whereas in the second embodiment, only the distance between target 6 and coils 7, 8 was taken into consideration.

In the first embodiment, when the target 6 moves, there is a variation in the area of the target 6 facing the coils 7, 8 and no longer just in the distance between the target 6 and the coils 7, 8.

In these two embodiments, there may be one or more emitter primary coils 7 and one or more receiver secondary coils 8.

The secondary coils 8 may be independent of one another and differ. For example, a first secondary coil may comprise two loops in opposite directions and of equal area generating a sine voltage signal at the output of the first secondary coil and a second secondary coil may comprise three loops including one large loop and two small loops, the two small loops being in the same direction and in the opposite direction to the large loop. The second secondary coil then generates a cosine voltage signal at the output of the second secondary coil.

The sine or cosine signals of the first and second secondary coils, respectively, may be temporally correlated by calculation means in order to precisely determine the position of the target 6 in the detection device.

In a third embodiment, the support element 12 may form an electrode for a capacitive sensor, the device fulfilling the dual function of inductive sensor and of capacitive sensor, the inductive sensor comprising at least one emitter primary coil 7 which may or may not be associated with at least one receiver secondary coil 8.

The invention relates to an exterior handle 2 or frame of an opening element of a motor vehicle comprising such a detection device and at least one elastically deformable external contour region aligned along a first predetermined axis A with the contact region 11, on the exterior face of the external portion 2a of the handle. The alignment of the target 6 with the printed circuit board 9 takes place along a second predetermined axis A' different from the first predetermined axis A.

Lastly, the invention relates to a motor vehicle comprising at least one such opening element handle 2 or frame on at least one opening element 1 present on the motor vehicle.

The invention claimed is:

1. A device for detecting the intention of a user to lock or unlock an opening element of a motor vehicle, the device being configured to be integrated into an opening element handle or frame, the device comprising:
    a housing containing a support element forming a single elongated lever arm including a first longitudinal free end and a second longitudinal end fixed to an anchoring point on the housing, a variation in a position of the support element along a predetermined axis occurring under pressure from a hand of the user on the opening element handle or frame, the support element having a region of contact with the opening element handle or frame and being associated with an amagnetic metal target disposed at the first longitudinal free end of the single elongated lever arm, the contact region being disposed away from the target by more than half of a total length of the support element, the contact region being adjacent the anchoring point on an outer surface of the housing;
    a printed circuit board;
    a voltage source; and
    at least one emitter primary coil, the lever arm being flexible toward the at least one emitter primary coil under the action of the pressure from the user on the opening element handle or frame which is transmitted to the contact region.

2. The detection device as claimed in claim 1, wherein the support element is a flexible strip that is elastically returned to a position corresponding to no pressure from the hand of the user on the opening element handle or frame.

3. The detection device as claimed in claim 2, wherein the support element forms a single piece with the target, the support element being made of an amagnetic conductive metal material.

4. The detection device as claimed in claim 2, wherein the support element and the target are made of brass or bronze.

5. The detection device as claimed in claim 2, wherein the contact region is a convex portion of the support element which is turned away from the printed circuit board toward the exterior of the device.

6. The detection device as claimed in claim 1, wherein the support element forms a single piece with the target, the support element being made of an amagnetic conductive metal material.

7. The detection device as claimed in claim 6, wherein the support element and the target are made of brass or bronze.

8. The detection device as claimed in claim 6, wherein the contact region is a convex portion of the support element which is turned away from the printed circuit board toward the exterior of the device.

9. The detection device as claimed in claim 1, wherein the support element and the target are made of brass or bronze.

10. The detection device as claimed in claim 9, wherein the second longitudinal end of the support element which is fixed to the anchoring point on the housing is secured toward a longitudinal end of the housing, the support element extending over more than half of a length of the housing.

11. The detection device as claimed in claim 10, wherein the support element is borne outside the detection device on a longitudinal end of a cover enclosing the housing, the cover having an opening through which penetrates the first longitudinal free end of the support element bearing the target.

12. The detection device as claimed in claim 9, wherein the contact region is a convex portion of the support element which is turned away from the printed circuit board toward the exterior of the device.

13. The detection device as claimed in claim 1, wherein the contact region is a convex portion of the support element which is turned away from the printed circuit board toward the exterior of the device.

14. The detection device as claimed in claim 1, wherein the at least one emitter primary coil is positioned on the printed circuit board and faces the target when the support element is in the flexed position, the target being borne on a face of the support element that is turned toward the at least one emitter primary coil and the printed circuit board.

15. The device as claimed in claim 14, further comprising at least one secondary coil that receives a magnetic field induced by said at least one emitter primary coil, a variation in the magnetic field and in an induced voltage received by said at least one secondary coil being detected by a detector configured to measure a parameter resulting from the induced voltage in the at least one secondary coil when the pressure from the hand of the user is applied to the opening element handle or frame.

16. The device as claimed in claim 15, wherein said at least one emitter primary coil and the at least one secondary coil are disposed in parallel respective planes, and perpendicular to a plane of the printed circuit board, a length of the target extending perpendicular to the first longitudinal free end of the support element.

17. The device as claimed in claim 15, wherein said at least one emitter primary coil and the at least one secondary coil are disposed in respective planes that are parallel to the plane of the printed circuit board, a length of the target extending parallel to and bearing against the first longitudinal free end of the support element.

18. The device as claimed in claim 1, wherein the support element forms an electrode for a capacitive sensor, the device fulfilling the dual function of inductive sensor and capacitive sensor.

19. An external handle or frame of an opening element of a motor vehicle, the external handle or frame comprising:
    the detection device as claimed in claim 1; and
    at least one elastically deformable external contour region that is aligned along the predetermined axis with the contact region.

20. A motor vehicle, comprising:
    at least one external handle or frame of the opening element as claimed in claim 19.

21. A device for detecting the intention of a user to lock or unlock an opening element of a motor vehicle, the device being configured to be integrated into an opening element handle or frame, the device comprising:
    a housing containing a support element forming a single elongated lever arm including a first longitudinal free end and a second longitudinal end fixed to an anchoring point on the housing, a variation in a position of the support element along a predetermined axis occurring under pressure from a hand of the user on the opening element handle or frame, the support element having a region of contact with the opening element handle or frame and being associated with an amagnetic metal target disposed at the first longitudinal free end of the single elongated lever arm, the contact region being disposed away from the target by more than half of a total length of the support element;

a printed circuit board;

a voltage source;

at least one emitter primary coil, the lever arm being flexible toward the at least one emitter primary coil under the action of the pressure from the user on the opening element handle or frame which is transmitted to the contact region, the at least one emitter primary coil being positioned on the printed circuit board and facing the target when the support element is in the flexed position, the target being borne on a face of the support element that is turned toward the at least one emitter primary coil and the printed circuit board; and at least one secondary coil that receives a magnetic field induced by said at least one emitter primary coil, a variation in the magnetic field and in an induced voltage received by said at least one secondary coil being detected by a detector configured to measure a parameter resulting from the induced voltage in the at least one secondary coil when the pressure from the hand of the user is applied to the opening element handle or frame.

22. A device for detecting the intention of a user to lock or unlock an opening element of a motor vehicle, the device being configured to be integrated into an opening element handle or frame, the device comprising:

a housing containing a support element forming a single elongated lever arm including a first longitudinal free end and a second longitudinal end fixed to an anchoring point on the housing, a variation in a position of the support element along a predetermined axis occurring under pressure from a hand of the user on the opening element handle or frame, the support element having a region of contact with the opening element handle or frame and being associated with an amagnetic metal target disposed at the first longitudinal free end of the single elongated lever arm, the contact region being disposed away from the target by more than half of a total length of the support element, the contact region being adjacent the anchoring point;

a printed circuit board;

a voltage source; and at least one emitter primary coil, the lever arm being flexible toward the at least one emitter primary coil under the action of the pressure from the user on the opening element handle or frame which is transmitted to the contact region, wherein the support element and the target are made of brass or bronze, wherein the second longitudinal end of the support element which is fixed to the anchoring point on the housing is secured toward a longitudinal end of the housing, the support element extending over more than half of a length of the housing, and wherein the support element is borne outside the detection device on a longitudinal end of a cover enclosing the housing, the cover having an opening through which penetrates the first longitudinal free end of the support element bearing the target.

23. A device for detecting the intention of a user to lock or unlock an opening element of a motor vehicle, the device being configured to be integrated into an opening element handle or frame, the device comprising:

a housing containing a support element forming a single elongated lever arm including a first longitudinal free end and a second longitudinal end fixed to an anchoring point on the housing, a variation in a position of the support element along a predetermined axis occurring under pressure from a hand of the user on the opening element handle or frame, the support element having a region of contact with the opening element handle or frame and being associated with an amagnetic metal target disposed at the first longitudinal free end of the single elongated lever arm, the contact region being disposed away from the target by more than half of a total length of the support element, the contact region being adjacent the anchoring point;

a printed circuit board;

a voltage source;

at least one emitter primary coil, the lever arm being flexible toward the at least one emitter primary coil under the action of the pressure from the user on the opening element handle or frame which is transmitted to the contact region, the at least one emitter primary coil being positioned on the printed circuit board and faces the target when the support element is in the flexed position, the target being borne on a face of the support element that is turned toward the at least one emitter primary coil and the printed circuit board; and at least one secondary coil that receives a magnetic field induced by said at least one emitter primary coil, a variation in the magnetic field and in an induced voltage received by said at least one secondary coil being detected by a detector configured to measure a parameter resulting from the induced voltage in the at least one secondary coil when the pressure from the hand of the user is applied to the opening element handle or frame.

* * * * *